US 6,534,803 B2

(12) United States Patent
Ohkubo

(10) Patent No.: US 6,534,803 B2
(45) Date of Patent: *Mar. 18, 2003

(54) ELECTRONIC DEVICE, SEMICONDUCTOR DEVICE, AND ELECTRODE FORMING METHOD

(75) Inventor: Hiroaki Ohkubo, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/433,969

(22) Filed: Nov. 4, 1999

(65) Prior Publication Data
US 2002/0070392 A1 Jun. 13, 2002

(30) Foreign Application Priority Data
Nov. 4, 1998 (JP) .......................... 10-327534

(51) Int. Cl.⁷ .............................. H01L 27/10
(52) U.S. Cl. ...................... 257/202; 257/208
(58) Field of Search ................ 257/903, 905, 257/907, 908, 910, 261, 296, 202, 203, 208; 438/618, 926

(56) References Cited

U.S. PATENT DOCUMENTS 5,998,846 A * 12/1999 Jan et al. .............. 257/401
6,165,692 A * 12/2000 Kanai et al. .......... 430/311

FOREIGN PATENT DOCUMENTS

| JP | 5-283437 | 10/1993 |
| JP | 6-175348 | 6/1994 |
| JP | A 7-183301 | 7/1995 |
| JP | 09-307075 | * 11/1997 |
| JP | 09-331030 | * 12/1997 |

* cited by examiner

Primary Examiner—Phat X. Cao
(74) Attorney, Agent, or Firm—Young & Thompson

(57) ABSTRACT

A DRAM includes a memory cell array section where a number of bit lines are located periodically and densely, and a peripheral circuit section formed at the outside of the memory cell array section and adjacent to the memory cell array section. A half of the bit lines formed in the memory cell array section are pulled out from the memory cell array section into the peripheral circuit section and are located periodically but sparsely in the peripheral circuit section. In the peripheral circuit section, the half of the bit lines have a portion which has a line width "B" larger than the line width "A" of the bit lines in the memory cell array section, and which is separated from the memory cell array section by a predetermined distance on the order of a minimum standardized size "D". A line space "C" in the memory cell array section and the minimum standardized size "D" fulfill the relation of $C \leq D \leq 2 \times C$.

6 Claims, 5 Drawing Sheets

PERIPHERAL CIRCUIT SECTION | MEMORY CELL ARRAY SECTION

ELECTRONIC DEVICE, SEMICONDUCTOR DEVICE, AND ELECTRODE FORMING METHOD

BACKGROUND OF THE INVENTION

The present invention relates to an electrode forming technique, and more specifically to an electronic device and a semiconductor device having a micro interconnection, and a method for forming an electrode.

Referring to FIG. 4, there is shown a layout diagram of bit lines and word lines under bit lines in a memory cell array of a conventional DRAM (dynamic random access memory). Ordinarily, the bit lines 2 and 3A in the DRAM memory cell array are periodically and densely located with a line width "A" and a line space "C" both of a minimum standardized size, and at one end of the memory cell array, a half number of bit lines 3A are caused to extend outwardly into a peripheral circuit section. Therefore, at the outside of the memory cell array, the density of the bit lines becomes a half of the density in the memory cell array, and the periodical pattern of the line and space changes. In the peripheral circuit section, the bit line 3A is connected through a contact 4 to an underlying diffused layer (not shown).

For example, Japanese Patent Application Pre-examination Publication Nos. JP-A-05-283437, and JP-A-06-175348 disclose a conventional method for forming a wiring or interconnection pattern. Here, JP-A-05-283437 and JP-A-06-175348 will be called a "first prior art" and a "second prior art", hereinafter, respectively.

The first prior art is a method for forming, in an active layer region, a gate pattern for a transistor having a structure in which a gate electrode is interposed between a source electrode and a drain electrode. At an outside of the active layer region but in the vicinity of the source electrode and the drain electrode, dummy patterns interposing a gate electrode therebetween are formed of a source/drain electrode metal, to have the same thickness as that of the source electrode and the drain electrode. Thereafter, a photoresist film is formed, and then is patterned for forming the gate pattern. Alternatively, the dummy patterns can be formed of a Schottky metal or an insulator in place of the source/drain metal. Namely, since the dummy patterns formed of the source/drain electrode metal and having the same thickness as that of the source electrode and the drain electrode were formed in the vicinity of the source electrode and the drain electrode, it is possible to easily uniformly and thinly form a gate finger pattern in the active layer region without increasing the number of steps in process. In addition, if the dummy patterns are formed of the Schottky metal, the characteristics of the transistor is elevated by a guard ring effect. If the dummy patterns are formed of the insulator, it is no longer necessary to pay attention to a leak current which is caused by adding the dummy pattern and which becomes one cause for a characteristics deterioration of the transistor, with the result that all of the advantage attributable to the shortening of the gate length can be enjoyed.

Referring to FIG. 5, there is shown an interconnection pattern in the second prior art. As shown in FIG. 5, the second prior art is a resist pattern forming method, in which when a photo mask used for a projection exposure has a synthesized graphic pattern composed of a first pattern 5 having a width W $\{\leq \Lambda/(2 \times NA)\}$ where $\Lambda$ is an exposure light wavelength and NA is a numerical aperture of a projection lens, and a second pattern 6 coupled to the first pattern, a step difference between the first pattern and the second pattern being not less than W/3, and a synthesized graphic pattern has a width expanded pattern 7 obtained by expanding the width of the first pattern over a predetermined length and at least at one side from the connection between the first pattern and the second pattern by $\{a \times W\}$ where $0.07 \leq a \leq 0.28$. In addition, the coherence degree of the projecting exposure light is not greater than 0.4, and the photo mask is a phase-shift mask for controlling the phase of a transmitted light.

With this arrangement, it is possible to prevent the thinning of the pattern at a width or size changing portion, which was a problem in the prior art when a pattern not exceeding a resolution limit is formed by a phase shift mask. Therefore, this method can be applied for forming a complicated pattern which is used in an actual device and which is near to the resolution limit. When a semiconductor device was fabricated by using this mask, the pattern could be micro-miniaturized in comparison with the conventional pattern, and therefore, the device area could be reduced.

However, under an exposure condition for lithography necessary to form fine patterns near to the resolution limit and located densely to each other, as in a memory cell array, a light intensity becomes relatively strong in a sparse pattern region, with the result that an overexposure occurs. Thus, the thinning of the resist pattern and an insufficient resolution become easy to occur.

In order to overcome this problem, the first prior art proposes to form an underlying dummy pattern at the outside of the interconnection region. However, if the density of the interconnections becomes a problem as shown in FIG. 4, the first prior art is not effective. Particularly, in a lead-out portion for pulling out the bit lines from the inside to the outside of the memory cell array section, the bit line is thinned as shown by dotted line in FIG. 4 or broken in an extreme case, with the result that the yield of production drops.

On the other hand, the second prior art avoids influence of a diffracted light by providing the width expanded portion 7 at the coupling portion between the pattern 5 having a narrow line width and the pattern 6 having a relatively wide line width. However, since the interconnection pattern ordinarily has a constant line and space, the influence itself of the diffracted light is small. In addition, if the line width is expanded at a region where the density changes, a short-circuiting becomes easy to occur between adjacent interconnections. Therefore, the second prior art cannot be applied.

BRIEF SUMMARY OF THE INVENTION

Accordingly, it is an object of the present invention to overcome the above mentioned problem of the prior art.

Another object of the present invention is to provide an electronic device, a semiconductor device, and an electrode forming method, which are capable of preventing the thinning or the break of bit lines in a region where the density of periodically located interconnections changes, thereby to improve the yield of production.

The above and other objects of the present invention are achieved in accordance with the present invention by an electronic device having a high interconnection density section where interconnections are located periodically and densely and a low interconnection density section where interconnections are located periodically but sparsely, wherein in the low interconnection density section, the interconnections have a portion which has a line width "B" larger than the line width "A" of the interconnections in the high interconnection density section, and which is separated from the high interconnection density section by a predetermined distance on the order of a minimum standardized size "D", and wherein a line space "C" in the high interconnection density section and the minimum standardized size "D" fulfill the relation of $C \leq D \leq 2 \times C$.

According to another aspect of the present invention, there is provided a semiconductor device having a memory cell array section having a high interconnection density where interconnections are located periodically and densely and a low interconnection density section where selected but not all ones of the interconnections in the memory cell array section are pulled out from the memory cell array section and are located periodically but sparsely. In the low interconnection density section, the selected but not all interconnections have a portion which has a line width "B" larger than the line width "A" of the interconnections in the memory cell array section, and which is separated from the memory cell array section by a predetermined distance on the order of a minimum standardized size "D". A line space "C" in the memory cell array section and the minimum standardized size "D" fulfill the relation of $C \leq D \leq 2 \times C$.

In a preferred embodiment, the interconnections located periodically and densely in the memory cell array section are a number of bit lines formed in the memory cell array section, and the low interconnection density section is a peripheral circuit section formed at the outside of the memory cell array section and adjacent to the memory cell array section. A half of the bit lines formed in the memory cell array section are pulled out from the memory cell array section into the peripheral circuit section and are located periodically but sparsely in the peripheral circuit section. In the peripheral circuit section, the half of the bit lines have a portion which has a line width "B" larger than the line width "A" of the bit lines in the memory cell array section, and which is separated from the memory cell array section by a predetermined distance on the order of a minimum standardized size "D". A line space "C" in the memory cell array section and the minimum standardized size "D" fulfill the relation of $C \leq D \leq 2 \times C$.

According to a third aspect of the present invention, there is provided an electrode forming method for forming an interconnection pattern having a high interconnection density section where interconnections are located periodically and densely and a low interconnection density section where interconnections are located periodically but sparsely, wherein in the low interconnection density section, the interconnections have a portion which has a line width "B" larger than the line width "A" of the interconnections in the high interconnection density section, and which is separated from the high interconnection density section by a predetermined distance, the method including forming the interconnections in such a manner that the portion having the line width "B" is separated from the high interconnection density section by a minimum standardized size "Di", and a line space "C" in the high interconnection density section and the minimum standardized size "D" fulfill the relation of $C \leq D \leq 2 \times C$.

Preferably, the high interconnection density section is a memory cell array section where interconnections are located periodically and densely, and in the low interconnection density section, selected but not all ones of the interconnections in the memory cell array section are pulled out from the memory cell array section and are located periodically but sparsely. In the low interconnection density section, the selected but not all interconnections have a portion which has the line width "B" larger than the line width "A" of the interconnections in the memory cell array section.

Alternatively, the high interconnection density section is a memory cell array section where interconnections are located periodically and densely, and the low interconnection density section is a peripheral circuit section formed at the outside of the memory cell array section and adjacent to the memory cell array section. A half of the bit lines formed in the memory cell array section are pulled out from the memory cell array section into the peripheral circuit section and are located periodically but sparsely in the peripheral circuit section. In the peripheral circuit section, the half of the bit lines have a portion which has the line width "B" larger than the line width "A" of the bit lines in the memory cell array section, and which is separated from the memory cell array section by the minimum standardized size "D".

The above and other objects, features and advantages of the present invention will be apparent from the following description of preferred embodiments of the invention with reference to the accompanying drawings.

DETAILED DESCRIPTION OF THE INVENTION

One embodiment of the electronic device in accordance with the present invention is a semiconductor device having a micro interconnection pattern. In a region where the density of periodically located interconnections changes, the line width "B" of a portion of the interconnections located in a low interconnection density section is made larger than the line width "A" of the interconnections located in a high interconnection density section B>A). Furthermore, a width expanded portion of the interconnections located in the low interconnection density section is separated from the high interconnection density section by a predetermined distance, preferably by a minimum standardized size "D". In addition, the line space "C" in the high interconnection density section and the minimum standardized size "D" are preferred to fulfill the following relation:

$$C \leq D \leq 2 \times C$$

For example, if a semiconductor memory is considered as the electronic device, in a region where the bit lines are pulled out from a memory cell array section to a peripheral circuit section and therefore where the density of periodically located bit lines changes, the line width "B" of a portion of bit lines in the peripheral circuit section having a low interconnection density is made larger than the line width "A" of bit lines in the memory cell array section having a high interconnection density (B>A). Furthermore, a width expanded portion of the bit lines in the peripheral circuit section is separated from an end of the memory cell array section by a predetermined distance, preferably by a minimum standardized size "D". In addition, the line space "C" in the memory cell array section and the minimum standardized size "D" from the end of the memory cell array section are preferred to fulfill the following relation:

$$C \leq D \leq 2 \times C$$

First Embodiment

Figure 1:
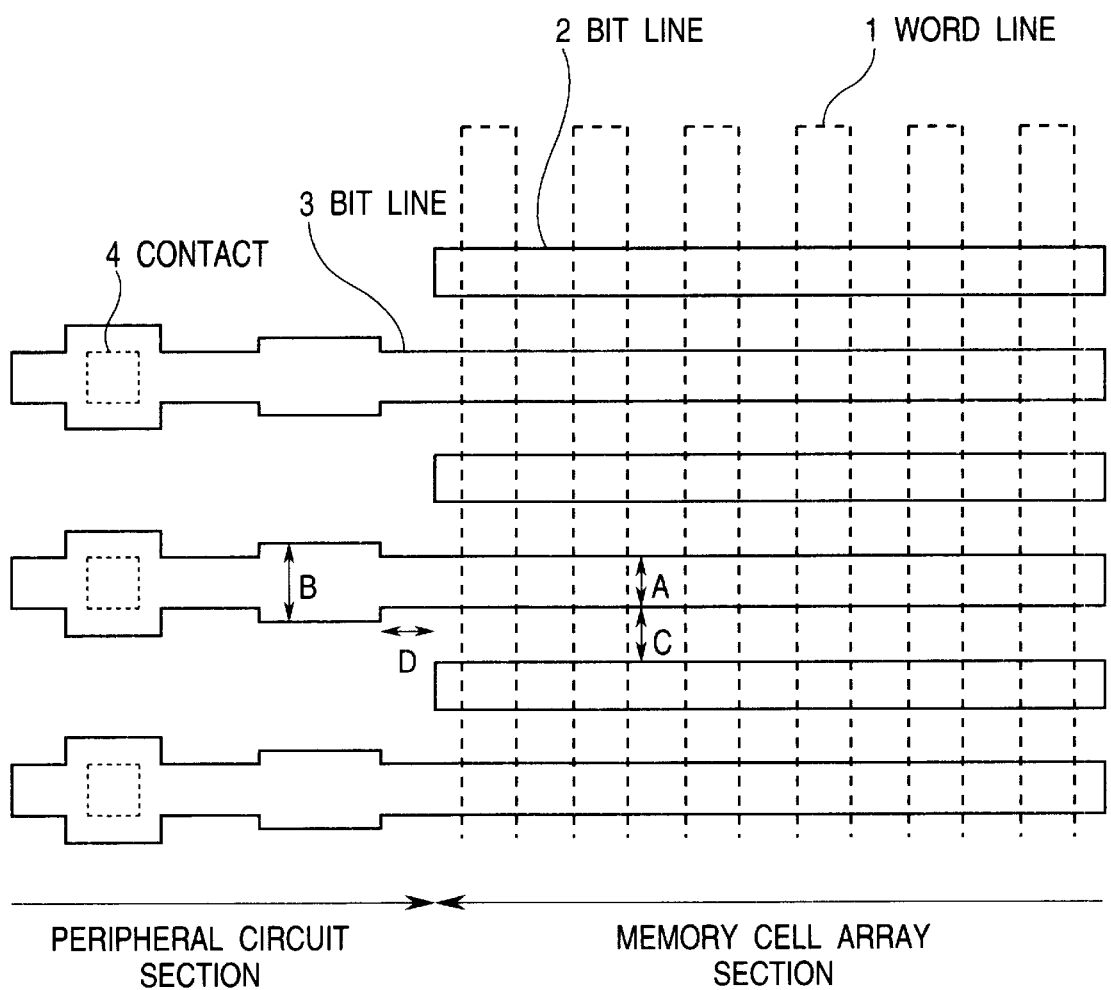
FIG. 1 is a layout diagram illustrating a first embodiment of the arrangement of bit lines and word lines under bit lines in a memory cell array of the DRAM in accordance with the present invention.

Referring to FIG. 1, there is shown a layout diagram illustrating a first embodiment of the arrangement of bit lines 2 and 3 and word lines 1 under the bit lines in a memory cell array of the DRAM in accordance with the present invention.

In a memory cell array section of the DRAM, the bit lines 2 and 3 are periodically and densely located with a constant line width "A" and a constant line space "C" both of a minimum standardized size. At one end of the memory cell array section, the bit lines 2 and 3 are caused alternately or every other to extend outwardly from the memory cell array section so that a half number of bit lines 3 extend continuously in the peripheral circuit section, as shown in FIG. 1. Therefore, at the outside of the memory cell array section, the periodical pattern of the line and space changes to the effect that the density of the bit lines in the peripheral circuit section becomes a half of the density of the bit lines in the memory cell array section. In the peripheral circuit section, the bit line 3 is connected through a contact 4 to an underlying diffused layer (not shown).

In a section where the bit lines 3 are pulled out from the memory cell array section, namely, in the peripheral circuit section, the bit lines 3 are formed to have an enlarged line width "B" in the proximity of a region where the line width is easy to be thinned, where B>A. This portion having the enlarged line width "B" is separated from a high bit line density section, namely, the memory cell array section, by the minimum standardized size "D".

In the above mentioned first embodiment, in the section where the bit lines 3 are pulled out from the memory cell array section to the outside of the memory cell array section, the thinning and the break of the bit lines 3 can be prevented by enlarging the line width of the bit line 3, with the result that the yield of production can be improved. In other words, in the section where the bit lines 3 are pulled out from the memory cell array section to the outside of the memory cell array section, since the thinning and the break of the bit lines 3 can be prevented with no short-circuiting between the bit lines, the yield of production can be improved. In addition, since the line width of the bit line 3 is enlarged separated from a high bit line density section (memory cell array section) by a predetermined distance ("D"), the thinning of the resist pattern and an insufficient resolution can be avoided even under an overexposure in which a light intensity becomes relatively strong in a sparse pattern region near to the dense pattern region under an exposure condition for lithography required to form highly dense fine patterns near to the resolution limit.

Second Embodiment

Figure 2:
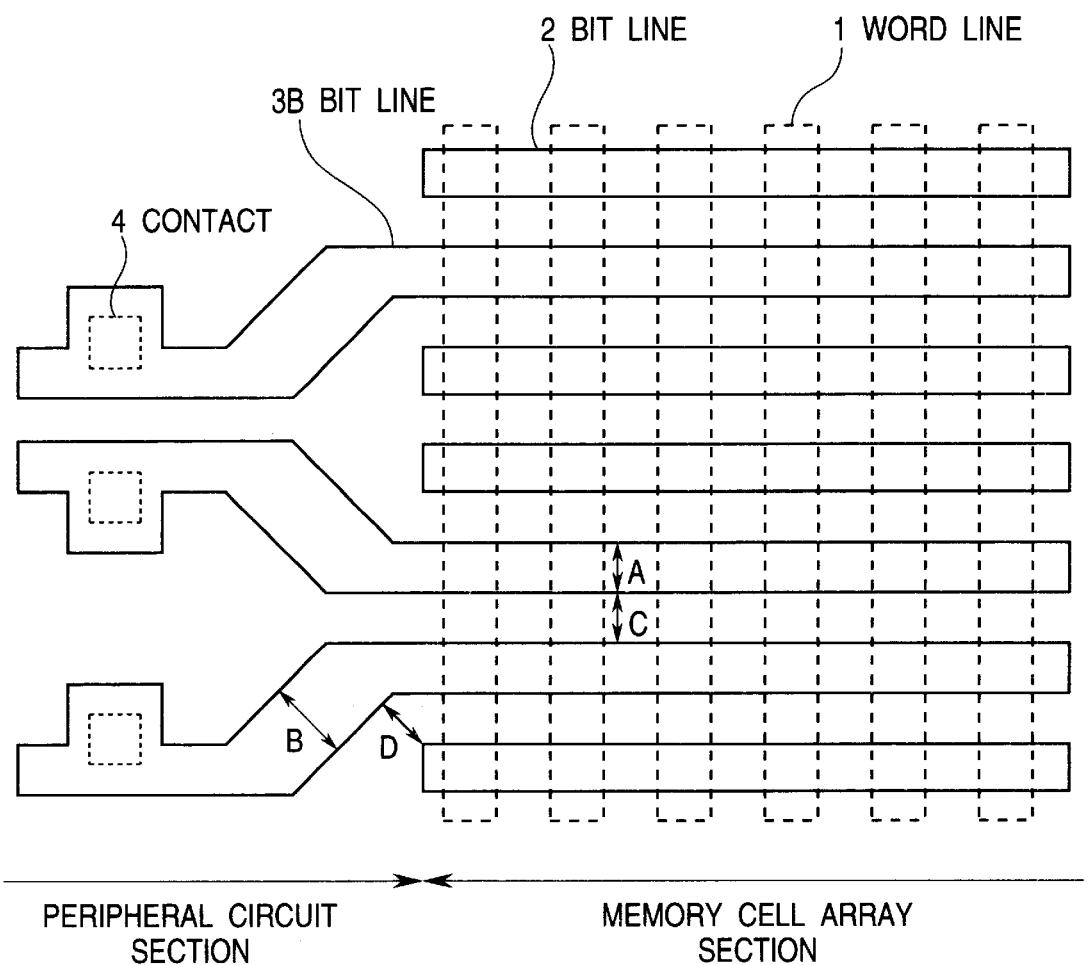
FIG. 2 is a layout diagram illustrating a second embodiment of the arrangement of bit lines and word lines under bit lines in a memory cell array of the DRAM in accordance with the present invention.

Referring to FIG. 2, there is shown a layout diagram illustrating a second embodiment of the arrangement of bit lines 2 and 3B and word lines 1 under the bit lines in a memory cell array of the DRAM in accordance with the present invention.

In a memory cell array section of the DRAM, the bit lines 2 and 3B are periodically and densely located with a constant line width "A" and a constant line space "C" both of a minimum standardized size. At one end of the memory cell array section, a half number of bit lines 3B are caused to extend outwardly and continuously into the peripheral circuit section. Therefore, at the outside of the memory cell array section, the periodical pattern of the line and space changes to the effect that the density of the bit lines in the peripheral circuit section becomes a half of the density of the bit lines in the memory cell array section. In the peripheral circuit section, the bit line 3B is connected through a contact 4 to an underlying diffused layer (not shown).

In a section where the bit lines 3B are pulled out from the memory cell array section, namely, in the peripheral circuit section, the bit lines 3B are formed to have an enlarged line width "B" in the proximity of a region where the line width is easy to be thinned, where B>A. This portion having the enlarged line width "B" is separated from a high bit line density section, namely, the memory cell array section, by the minimum standardized size "D".

This second embodiment is different from the first embodiment, in which each two adjacent bit lines 3B are pulled out from the memory cell array section for each four adjacent bit lines 2 and 3B, as shown in FIG. 2. Furthermore, the pulled-out portion of each two adjacent bit lines 3B are bent to be separated from each other.

However, regardless of a manner for pulling out the bit lines from the memory cell array section and regardless of the location of the pulled-out bit lines in the peripheral circuit section, it is possible to prevent the thinning and break of the bit lines 3B with no short-circuiting between the bit lines, by enlarging the pulled-out bit lines at a position separately from the end of the high density interconnection region by the minimum standardized size "D".

Figure 3:
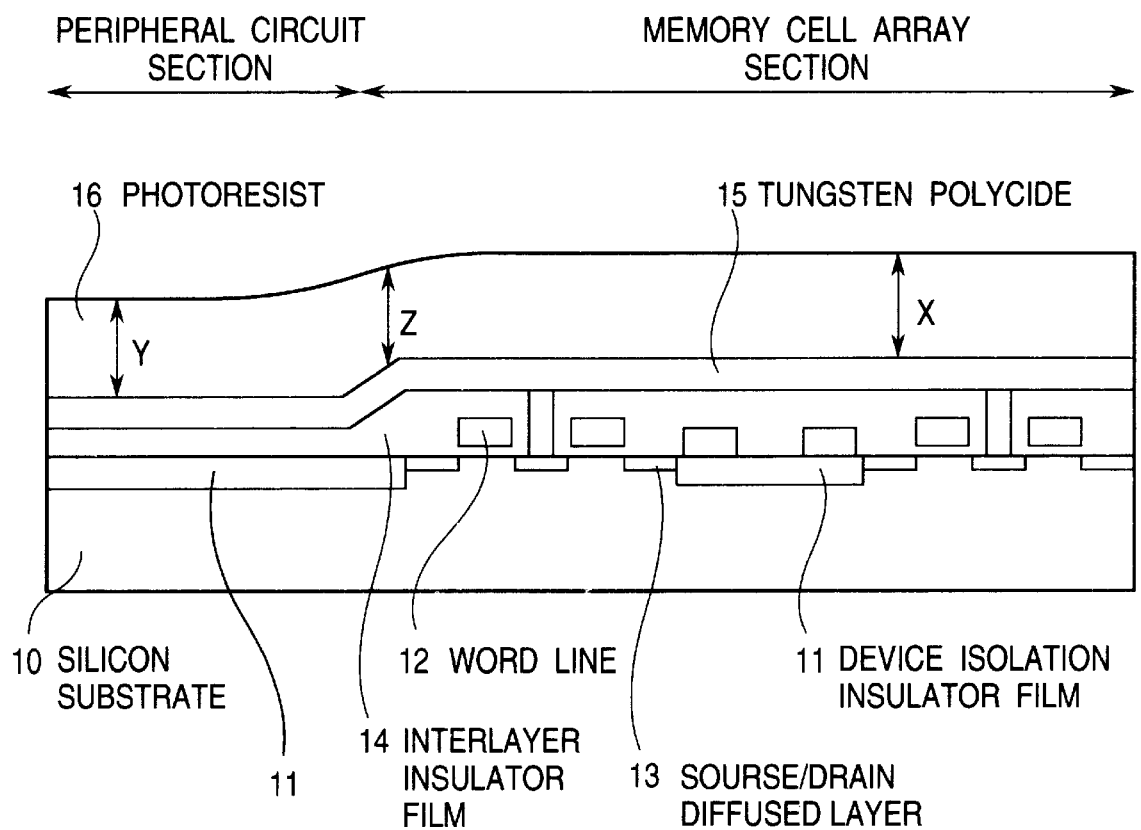
FIG. 3 is a diagrammatic section view in the bit line extending direction of the device shown in FIG. 2.
Figure 4:
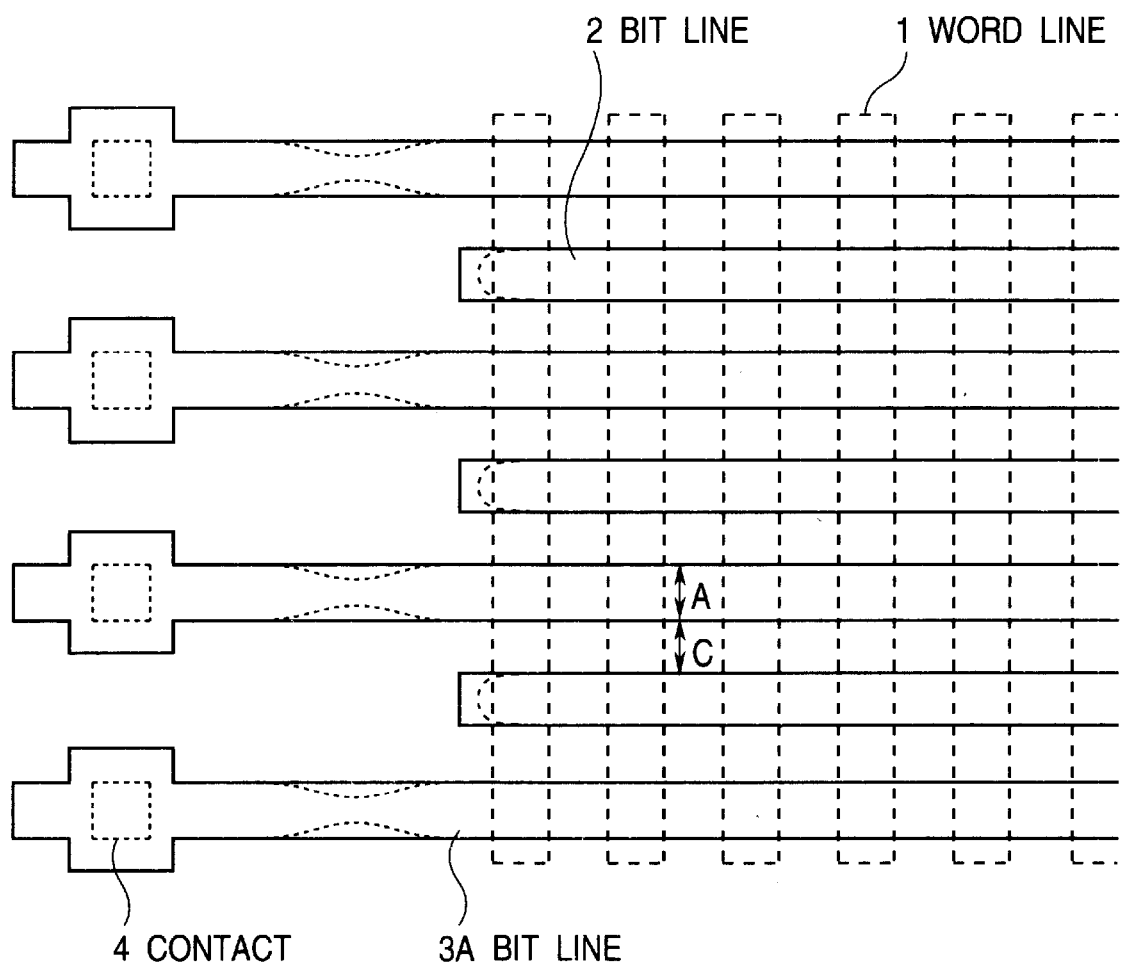
FIG. 4 is a layout diagram of bit lines and word lines under bit lines in a memory cell array of a conventional DRAM.
Figure 5:
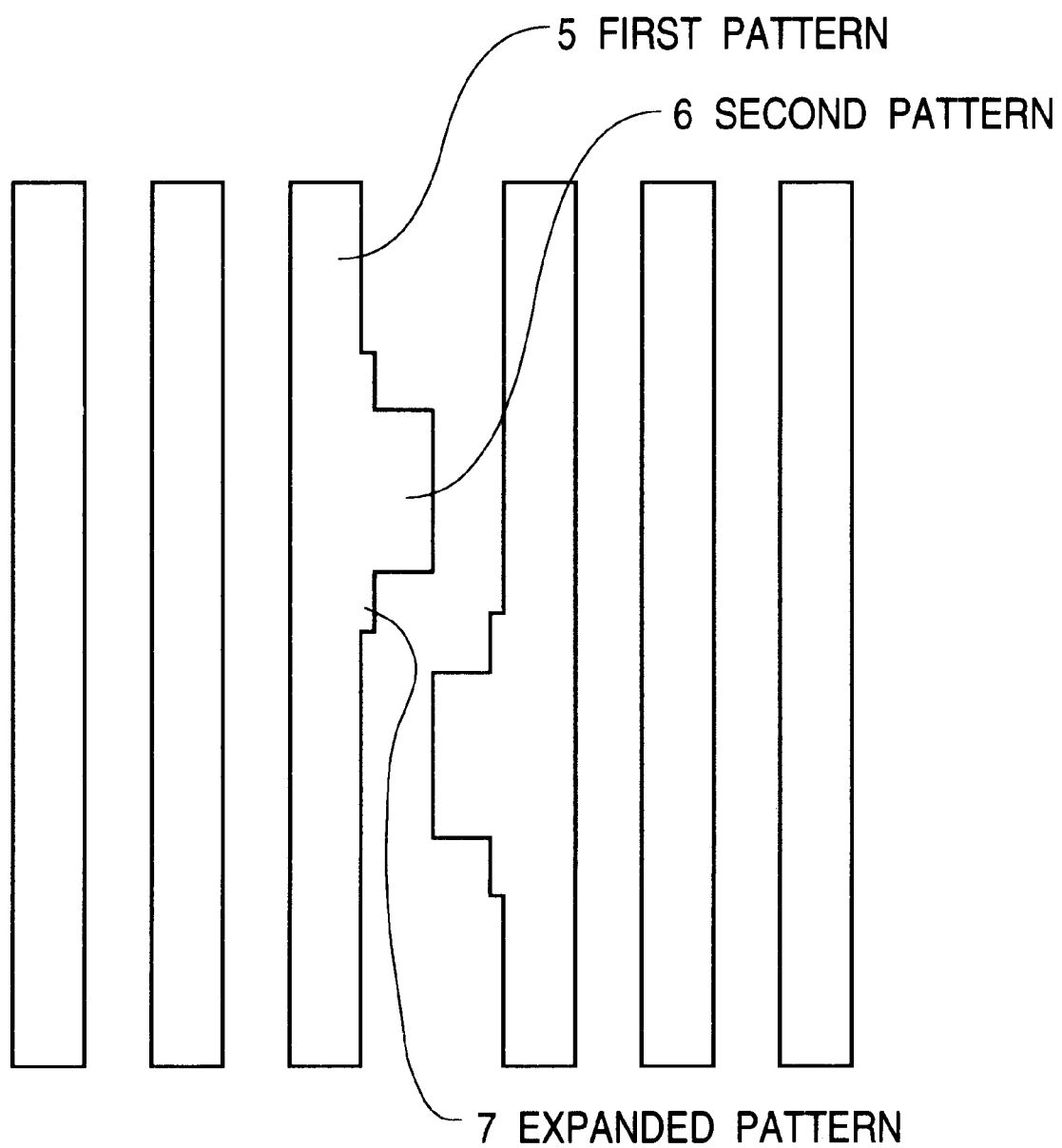
FIG. 5 is a diagram illustrating an interconnection pattern of the second prior art.

Here, the width enlarged portion of the bit line 3B having the line width "B" positionally corresponds to a step region or a transition region where a height of an underlying interlayer insulator film 14 changes because an underlying gate electrode no longer exists, as shown in FIG. 3. FIG. 3 is a diagrammatic section view in the bit line extending direction of the device shown in FIG. 2, for illustrating a middle way in a process for forming the structure shown in FIG. 2.

On a principal surface of a silicon substrate 10, a device isolation insulator film is formed to confine a number of device formation regions, and a plurality of word lines 12 functioning as a gate electrode are located to extend perpendicular to the sheet of the drawing, with a gate insulator film being located between the gate electrode and the principal surface of the silicon substrate 10. A pair of diffused layers 13 are formed in the substrate 10 at opposite sides of the word line 12 within each device formation region, so as to form a source region and a drain region, respectively. An interlayer insulator film 14 is formed to cover the word lines 12 and the principal surface of the silicon substrate 10.

In the shown example, the gate electrodes, namely, the word lines are formed in the memory cell array section, but are not formed in the peripheral circuit section at the outside of the memory cell array section. Therefore, the height of the a surface of the interlayer insulator film 14 in the memory cell array section is higher than that of the top surface of the interlayer insulator film 14 in the peripheral circuit section at the outside of the memory cell array section, with the result that a step is formed at a boundary between the memory cell array section and the peripheral circuit section.

In this condition, a tungsten polycide film 15 is formed on the whole surface, and a photo resist film 16 is deposited to cover the tungsten polycide film 15. The photo resist film 16 is patterned, and the tungsten polycide film 15 is etched using the patterned photo resist film as a mask, so that the bit lines 2 and 3B are formed.

In the above mentioned process, a film thickness of the photo resist 16 become a predetermined thickness in the memory cell array section and in the peripheral circuit section (X=Y=predetermined thickness), but becomes thinner than the predetermined thickness in the boundary region forming the step (Z<X=Y). Because the film thickness of the photo resist becomes relatively thin in the step portion, the patterned photo resist for the bit line is easy to become thin and to cause an insufficient resolution in the step portion. However, in this embodiment, since the line width of the bit line 3B is enlarged in the vicinity of the step portion, it is possible to prevent the thinning and the break of the bit lines (interconnections).

Summarizing the second embodiment mentioned above, in the section where the bit lines 3B are pulled out from the memory cell array section to the outside of the memory cell array section, the thinning and the break of the bit lines 3B can be prevented by enlarging the line width of the bit line 3B, with the result that the yield of production can be improved. In other words, in the section where the bit lines 3B are pulled out from the memory cell array section to the outside of the memory cell array section, since the thinning and the break of the bit lines 3B can be prevented with no short-circuiting between the bit lines, the yield of production can be improved. In addition, since the line width of the bit line 3B is enlarged at a position separated from a high bit line density section (memory cell array section) by a predetermined distance ("D"), the thinning of the resist pattern and an insufficient resolution can be avoided even under an overexposure in which a light intensity becomes relatively strong in a sparse pattern region near to the dense pattern region under an exposure condition for lithography required to form highly dense fine patterns near to the resolution limit.

In the above mentioned embodiments, the present invention has been applied to the interconnections in the DRAM, but it would be apparent to persons skilled in the art that the present invention can be applied to not only the DRAM but also micro interconnections in an integrated circuit such as a system LSI and ASIC, micro interconnections in a discrete circuit device, and micro interconnections in general electronic device. In addition, the number, the position and the shape of the constituents in the above mentioned embodiments are in no way limited to the above mentioned number, position and shape, but can assume any number, position and shape.

As seen from the above, according to the present invention, in the section where interconnections are pulled out from a high interconnection density section to the outside of the high interconnection density section, since the thinning and the break of the interconnections can be prevented with no short-circuiting between the interconnections, the yield of production can be improved.

The invention has thus been shown and described with reference to the specific embodiments. However, it should be noted that the present invention is in no way limited to the details of the illustrated structures but changes and modifications may be made within the scope of the appended claims.

What is claimed is:

1. An electronic device comprising:
   a first interconnection section having a first interconnection density;
   a plurality of contacts; and
   a second interconnection section located between and connecting said first interconnection section and said plurality of contacts,
   said second interconnection section having a second interconnection density lower than said first interconnection density,
   said second interconnection section and a part of said first interconnection section being connected as a plurality of integral electrically connected interconnections,
   said plural interconnections in said first interconnection section having a line width "A",
   at least one of said plural interconnections in said second interconnection section having a first line width portion with a line width "B" and a second line width portion with a line width "A", "B" being greater than "A".

2. The semiconductor device according to claim 1, wherein,
   said first line width portion is separated from an edge of said first interconnection section by a distance "D",
   between two of said plural interconnections of said first interconnection section there is a line space "C", and
   said distance "D" fulfills the relation of $C \leq D \leq 2C$.

3. The semiconductor device according to claim 1, wherein,
   each of said plural interconnections in said second interconnection section have the first line portion with the line width "B".

4. An electronic device comprising:
   a first interconnection section;
   a plurality of contacts; and
   a second interconnection section between said first interconnection section and said plurality of contacts, said second interconnection section having a lower interconnection density than said first interconnection section,
   wherein said first and second interconnection sections comprise a plurality of coplanar bit lines,
   at least one of said plurality of bit lines in said second interconnection section having a first portion with a line width "B" greater than a line width of said plurality of bit lines in said first interconnection section, and a second portion connected to one of said plurality of contacts.

5. The semiconductor device according to claim 4, wherein,
   said first portions are separated from an edge of said first interconnection section by a distance "D", and
   said first interconnection section has a line spacing "C" between each two of said plurality of interconnections, and
   said distance "D" fulfills the relation of $C \leq D \leq 2*C$.

6. A method of forming an electrode interconnection pattern comprising the steps of:
   forming a first interconnection section joined to a second interconnection section,
   said first interconnection section having a first interconnection density, said second interconnection section having a second interconnection density, said first interconnection density being higher than said second interconnection density, wherein said second interconnection section and a part of said first interconnection section comprise a plurality of interconnections extending from said first interconnection section through said second interconnection section, a first portion of at least one of said plurality of interconnections, in said second interconnection section, having a line width "B" greater than a line width of said plurality of interconnections in said first interconnection section, wherein said forming the second interconnection section step further comprises forming the first portions so that the first portions are separated from an edge of said first interconnection section by a distance "D", and a line space between two of said plurality of interconnections in said first interconnection section is a distance "C", and said distance "D" fulfills the relation of $C \leqq D - 2 \times C$.

* * * * *